(12) United States Patent
Nishikawa

(10) Patent No.: US 10,290,821 B2
(45) Date of Patent: May 14, 2019

(54) DISPLAY DEVICE AND MANUFACTURING METHOD OF THE SAME

(71) Applicant: Japan Display Inc., Tokyo (JP)

(72) Inventor: Hiromi Nishikawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/718,043

(22) Filed: Sep. 28, 2017

(65) Prior Publication Data
US 2018/0108852 A1 Apr. 19, 2018

(30) Foreign Application Priority Data
Oct. 14, 2016 (JP) .................................. 2016-202359

(51) Int. Cl.
H01L 51/00 (2006.01)
H01L 27/32 (2006.01)

(52) U.S. Cl.
CPC ...... *H01L 51/0097* (2013.01); *H01L 27/3276* (2013.01); *H01L 51/003* (2013.01); *H01L 27/3248* (2013.01); *H01L 27/3265* (2013.01); *H01L 2227/323* (2013.01); *H01L 2227/326* (2013.01)

(58) Field of Classification Search
None
See application file for complete search history.

(56) References Cited

FOREIGN PATENT DOCUMENTS

JP 2011-008937 A 1/2011

*Primary Examiner* — Long Pham
(74) *Attorney, Agent, or Firm* — Typha IP LLC

(57) ABSTRACT

Provided is a display device having a substrate and a plurality of pixels. The substrate includes a first base film, a second base film; and a metal mesh which is located between the first base film and the second base film and has a first region and a second region. The pixels overlap with the first region through the second base film. The first region and the second region overlap with each other so that a part of the substrate overlaps with another part of the substrate, and a mesh size of the second region is larger than a mesh size of the first region.

8 Claims, 18 Drawing Sheets

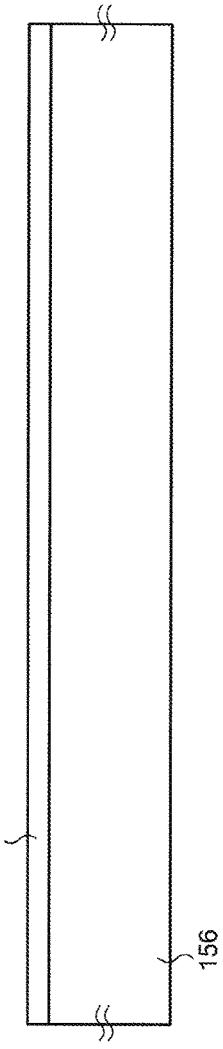
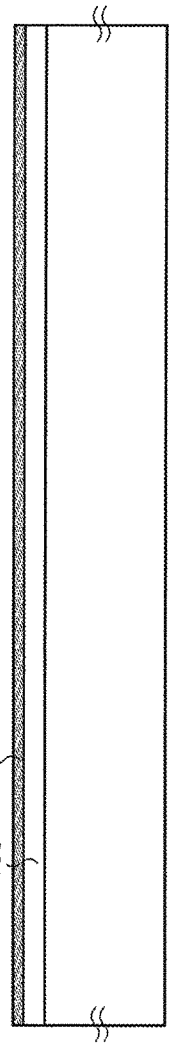
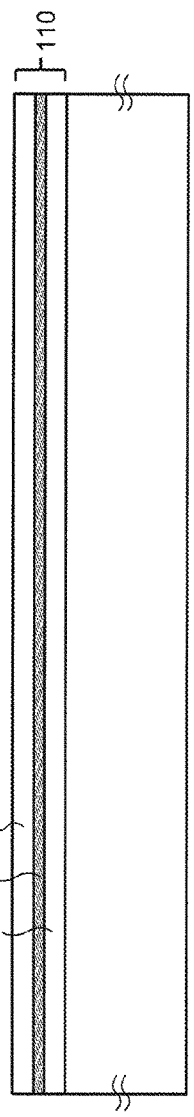
FIG. 12A
FIG. 12B
FIG. 12C

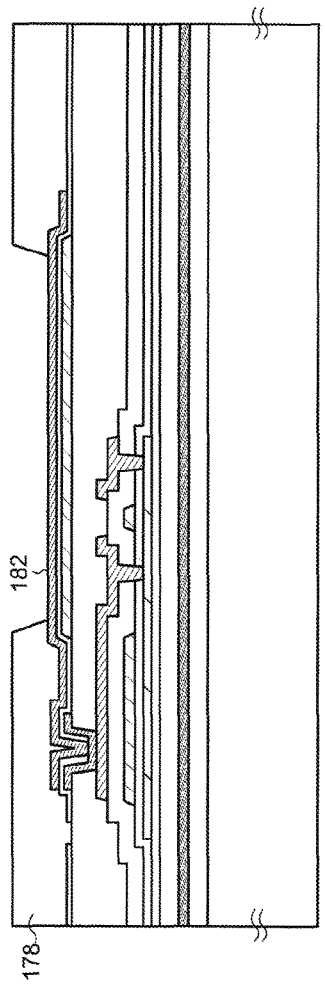
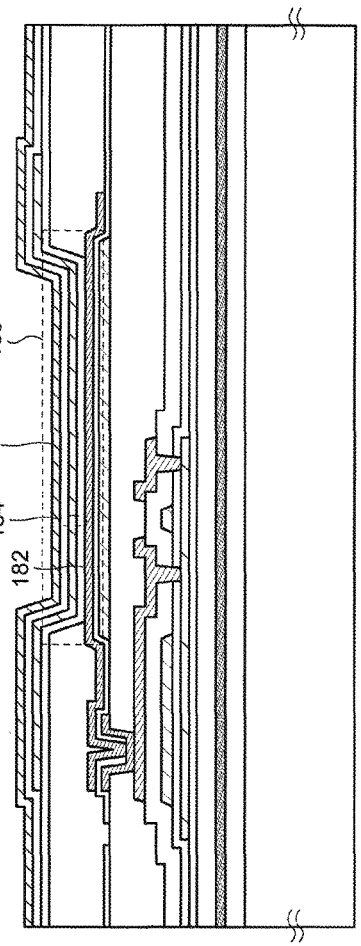
FIG. 16A
FIG. 16B

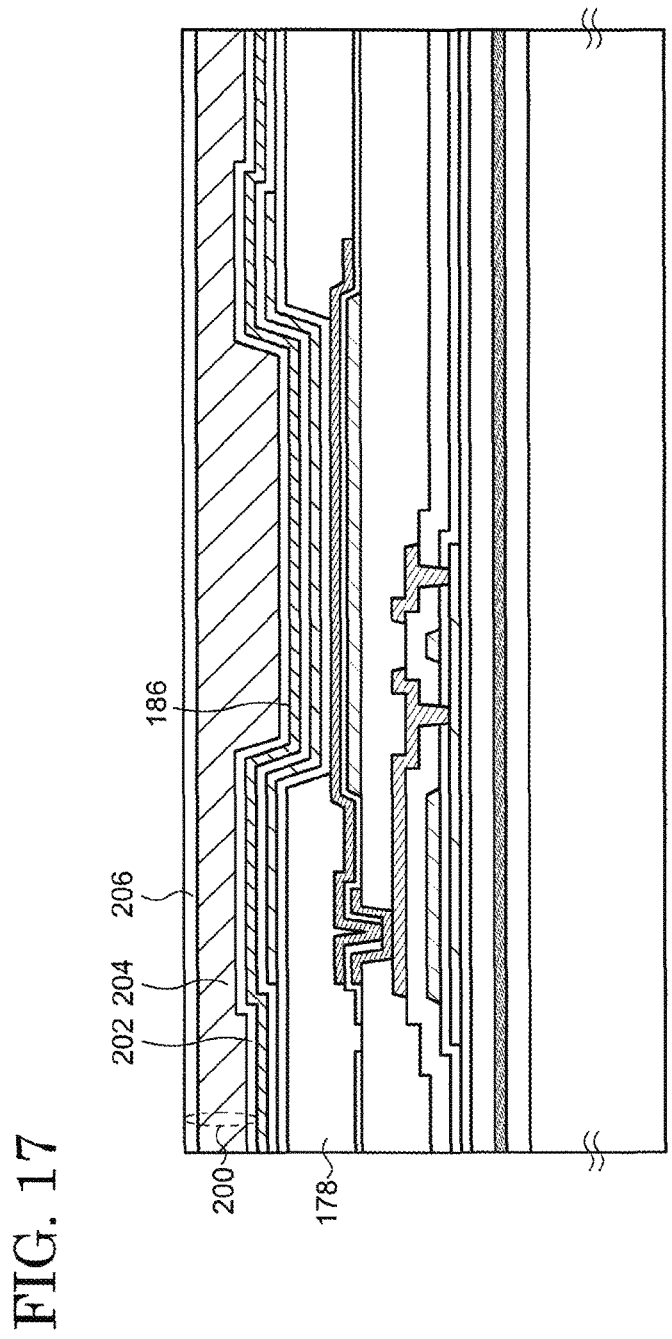

DISPLAY DEVICE AND MANUFACTURING METHOD OF THE SAME

CROSS REFERENCE TO RELATED APPLICATIONS

This application is based on and claims the benefit of priority from the prior Japanese Patent Application No. 2016-202359, filed on Oct. 14, 2016, the entire contents of which are incorporated herein by reference.

FIELD

The present invention relates to a display device and a manufacturing method of the display device. For example, the present invention relates to a flexible display device and a manufacturing method thereof.

BACKGROUND

An organic EL (Electroluminescence) display device is represented as an example of a display device. An organic EL display device has an organic light-emitting element (hereinafter, referred to a light-emitting element) in each of a plurality of pixels formed over a substrate. A light-emitting element has a layer including an organic compound between a pair of electrodes and is operated by supplying current between the pair of electrodes. Since a light-emitting element is formed as an all-solid type display element, no change occurs in a gap between the substrates even if the substrates are provided with flexibility and folded or bent. Thus, bending and folding a display device does not influence display quality in principle. This feature has been utilized to manufacture a so-called flexible display (sheet display) in which a light-emitting element is fabricated over a flexible substrate. For example, Japanese patent application publication No. 2011-8937 discloses an organic EL display device having flexibility and a structure member for heat radiation arranged on an outer surface of a substrate.

SUMMARY

An embodiment of the present invention is a display device having a substrate and a plurality of pixels. The substrate includes a first base film, a second base film, and a metal mesh located between the first base film and the second base film and having a first region and a second region. The pixels overlap with the first region through the second base film. The first region and the second region overlap with each other so that a part of the substrate overlaps with a part of the substrate, and a mesh size of the second region is larger than a mesh size of the first region.

An embodiment of the present invention is a display device having a substrate and a plurality of pixels. The substrate includes a first base film, a second base film, and a metal mesh located between the first base film and the second base film and having a first region, a second region, and a third region where the second region is sandwiched between the first region and the third region. The pixels overlap with the first region through the second base film. The second region is bent, and a mesh size of the second region is larger than a mesh region of the first region.

An embodiment of the present invention is a manufacturing method of a display device. The manufacturing method includes forming, over a first base film, a metal mesh having a first region and a second region, forming a second base film over the metal mesh, and forming a plurality of pixels so as to overlap with the first region through the second base film. A mesh size of the second region is larger than a mesh size of the first region.

An embodiment of the present invention is a manufacturing method of a display device. The manufacturing method includes forming, over a first base film, a metal mesh having a first region, a third region, and a second region sandwiched between the first region and the third region, forming a second base film over the metal mesh, forming a plurality of pixels so as to overlap with the first region through the second base film, forming a terminal so as to overlap with the third region through the second base film, and forming a wiring electrically connecting the terminal to the pixels so as to overlap with the second region through the second base film. A mesh size of the second region is larger than a mesh size of the first region.

BRIEF DESCRIPTION OF DRAWINGS

FIG. 12A to FIG. 12C are schematic cross-sectional views for explaining a manufacturing method of a display device according to an embodiment;

FIG. 16A and FIG. 16B are schematic cross-sectional views for explaining a manufacturing method of a display device according to an embodiment;

FIG. 17 is a schematic cross-sectional view for explaining a manufacturing method of a display device according to an embodiment.

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present invention, when a plurality of films is formed by performing etching or light irradiation on one film, the plurality of films may have functions or rules different from each other. However, the plurality of films originates from a film formed as the same layer in the same process and has the same layer structure and the same material. Therefore, the plurality of films is defined as films existing in the same layer.

In the specification and the scope of the claims, unless specifically stated, when a state is expressed where a structure is arranged "over" another structure, such an expression includes both a case where the substrate is arranged immediately above the "other structure" to be in contact with the "other structure" and a case where the structure is arranged over the "other structure" with an additional structure therebetween.

First Embodiment

In the present embodiment, a display device according to an embodiment of the present invention is explained by using FIG. 1A to FIG. 10.

Figure 1A:
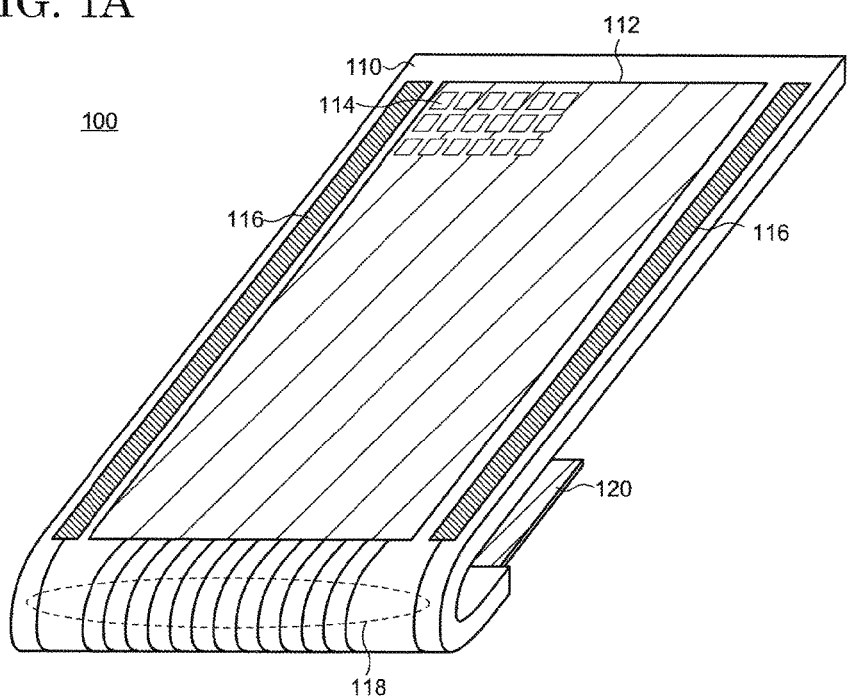
FIG. 1A and FIG. 1B are respectively a schematic perspective view and side view of a display device according to an embodiment.

A schematic perspective view of a display device 100 according to the present embodiment is shown in FIG. 1A. The display device 100 has a substrate 110. The substrate 110 may have flexibility or may have rigidity so as not to undergo deformation. When the substrate 110 has flexibility, the display device 100 is capable of having a folded configuration in which a part of the substrate 110 is bent as shown in FIG. 1A. A plurality of pixels 114 is provided to the substrate 110. The plurality of pixels 114 is arranged in a matrix form to give a display region 112. Driver circuits 116 for controlling driving of the pixels 114 are formed over the substrate 110. It is not necessary for the driver circuits 116 to be directly formed over the substrate 110, and a driver circuit 116 formed over another substrate (e.g., semiconductor substrate) may be mounted on the substrate 110.

Wirings 118 extend from the pixels 114 and the driver circuits 116 to a side surface of the substrate 110. Here, the wirings 118 extend from the display region 112 including the pixels 114 to a connector 120 through a bent region of the substrate 110. Therefore, the wirings 118 are bent along this region. A variety of signals generated in an external circuit not illustrated is supplied to the driver circuits 116 and the display region 112 through the connector 120. As the connector 120, a flexible printed circuit (FPC) substrate is represented, for example.

Figure 1B:
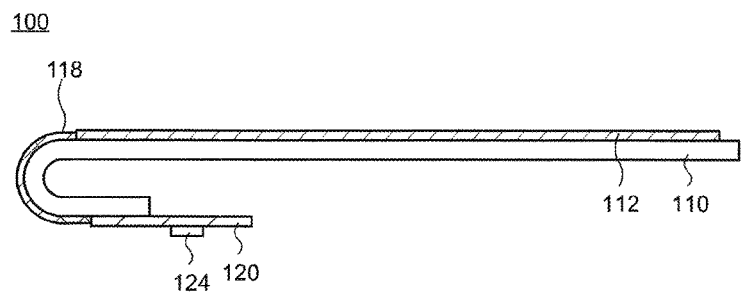

FIG. 1B is a schematic side view of the display device 100. The display region 112 formed by the plurality of pixels 114 is formed on one surface of the substrate 110 (hereinafter, a surface on which the display region 112 is formed is referred to as a first surface, while a surface opposite to the first surface is referred to as a second surface), and the connector 120 is fixed on the same surface via an adhesion layer having conductivity, such as an anisotropic conductive film. As described above, the wirings 118 are bent along the bent region and electrically connect the display region 112 to terminals 122 (described below) covered by the connector 120. A driver circuit 124 for driving the pixels 114 may be mounted over the connector 120. The driver circuit 124 may include an integrated circuit manufactured by utilizing a semiconductor substrate, for example.

Figure 2:
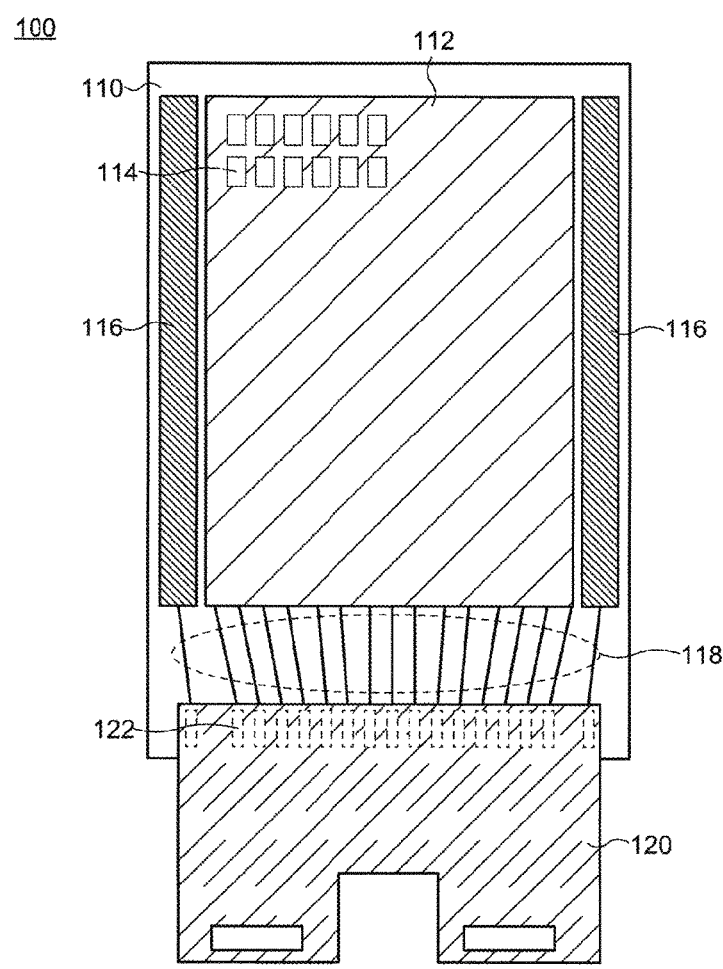
FIG. 2 is a schematic top view of a display device according to an embodiment.

FIG. 2 illustrates a state where the display device 100 shown in FIG. 1A is deformed into a flat shape. As shown in FIG. 2, the wirings 118 extend from the display region 112 and the driver circuits 116 in a direction toward one side of the substrate 110. The wirings 118 are exposed at a vicinity thereof to form the terminals 122. Thus, the terminals 122 and the wirings 118 are also located over the first surface of the substrate 110. The terminals 122 are electrically connected to the connector 120, and a variety of signals is supplied from the external circuit to the driver circuits 116 and pixels 114 via the connector 120, the terminals 122, and the wirings 118.

Figure 3A:
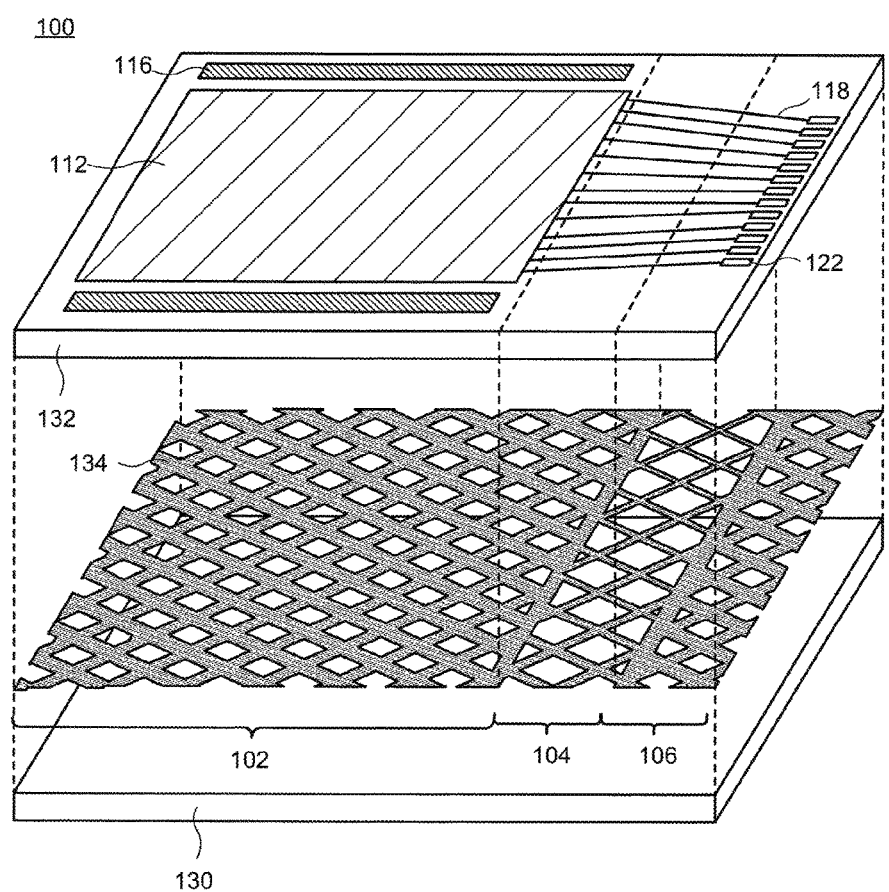
FIG. 3A and FIG. 3B are respectively a schematic developed view and side view of a display device according to an embodiment.
Figure 3B:
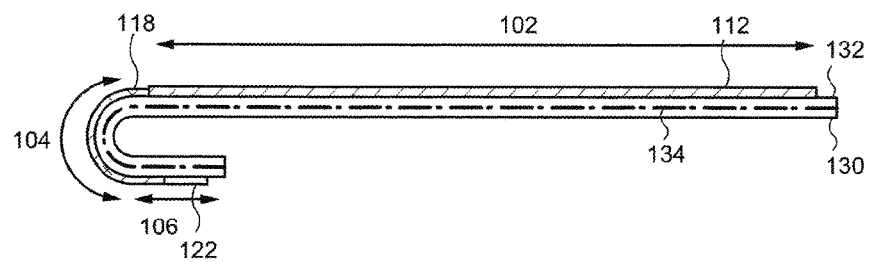

A perspective view of the display device 100 in a state where the substrate 110 is developed is shown in FIG. 3A. The substrate 110 has a first base film 130, a second base film 132, and a metal film 134 disposed between the first base film 130 and the second base film 132. A bottom surface of the first base film 130 is the second surface of the substrate 110, and a top surface of the second base film 132 corresponds to the first surface of the substrate 110. The metal film 134 has a mesh form. Hence, the metal film 134 may be described as a metal mesh. The metal mesh 134 may have 0-valent metal. For example, the metal mesh 134 may include a metal such as tungsten, molybdenum, titanium, tantalum, chromium, aluminum, and copper or an alloy thereof. Note that the first base film 130 is not necessarily provided. In this case, the second base film 132 is exposed from openings of the metal mesh 134.

The metal mesh 134 possesses a plurality of regions, and a mesh size in one of the regions is larger than that of any other regions. In other words, the metal mesh 134 is arranged more sparsely in this one region than any other regions. For example, as shown in FIG. 3A, the metal mesh 134 can have three regions (first region 102, second region 104, and third region 106). In a state where the display device 100 is folded, the display region 112 and the pixels 114 forming the display region 112 can overlap with the first region 102 of the metal mesh 134 via the second base film 132 as shown in the side view of FIG. 3B. On the other hand, the terminals 122 are capable of overlapping with the third region 106 of the metal mesh 134 via the second base film 132. The wirings 118 are able to overlap with the second region 104 of the metal mesh 134 via the second base film 132. In the case where the display device 100 is folded by bending the second region 104, the first region 102 and the third region 106 overlap with each other, and a part of the substrate 110 simultaneously overlaps with another part thereof.

Figure 4:
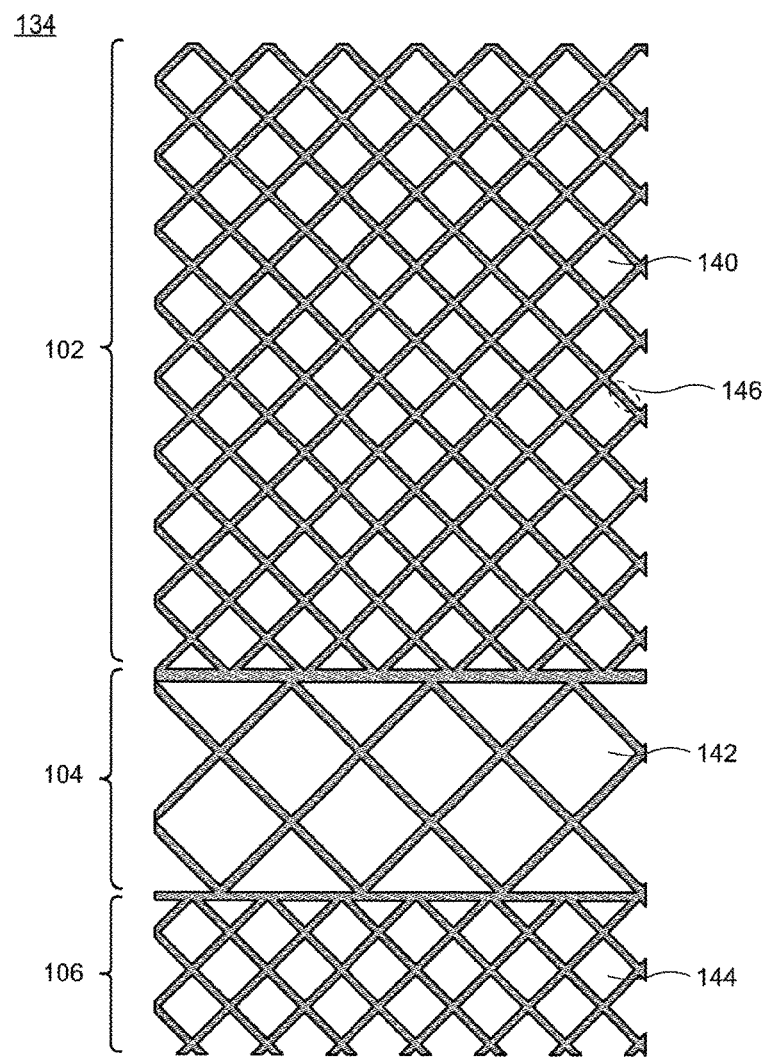
FIG. 4 is a schematic top view of a metal mesh of a display device according to an embodiment.

FIG. 4 is a schematic top view of the metal mesh 134. As described above, the metal mesh 134 may have the regions with different mesh sizes. In the example shown in FIG. 4, the second region 104 having a large mesh size (mesh is sparse) is sandwiched by the first region 102 and the third region 106 having a small mesh size (mesh is dense). Each of the regions has a plurality of openings (140, 142, and 144). In each of the regions, the openings can be regularly arranged, thereby forming a mesh structure.

An area of the opening 142 in the second region 104 is larger than an area of the opening 140 of the first region 102. Similarly, the area of the opening 142 of the second region 104 is larger than an area of the opening 144 of the third region 106. The opening 140 and the opening 144 may have the same area or have different areas.

A total area or a total volume occupied by a metal in the region (second region 104) having a large mesh size is smaller than that of the other regions (first region 102 and third region 106). Therefore, the second region 104 has lower rigidity and higher flexibility compared with the first region 102 and the third region 106. Hence, the second region 104 is readily bent, whereas a given shape is readily maintained in the first region 102 and the third region 106. Therefore, as shown in FIG. 1A and FIG. 1B, the second region 104 can be bent to stack the connector 120 over the display region 112, thereby reducing an apparent area of the display device 100. The entire or a part of the display region 112 can be maintained in a flat structure by stacking the first region 102 and the display region 112. The connector 120 can be readily fixed over the terminals 122 by designing the metal mesh 134 so that the third region 106 overlaps with the terminals 122.

Figure 5:
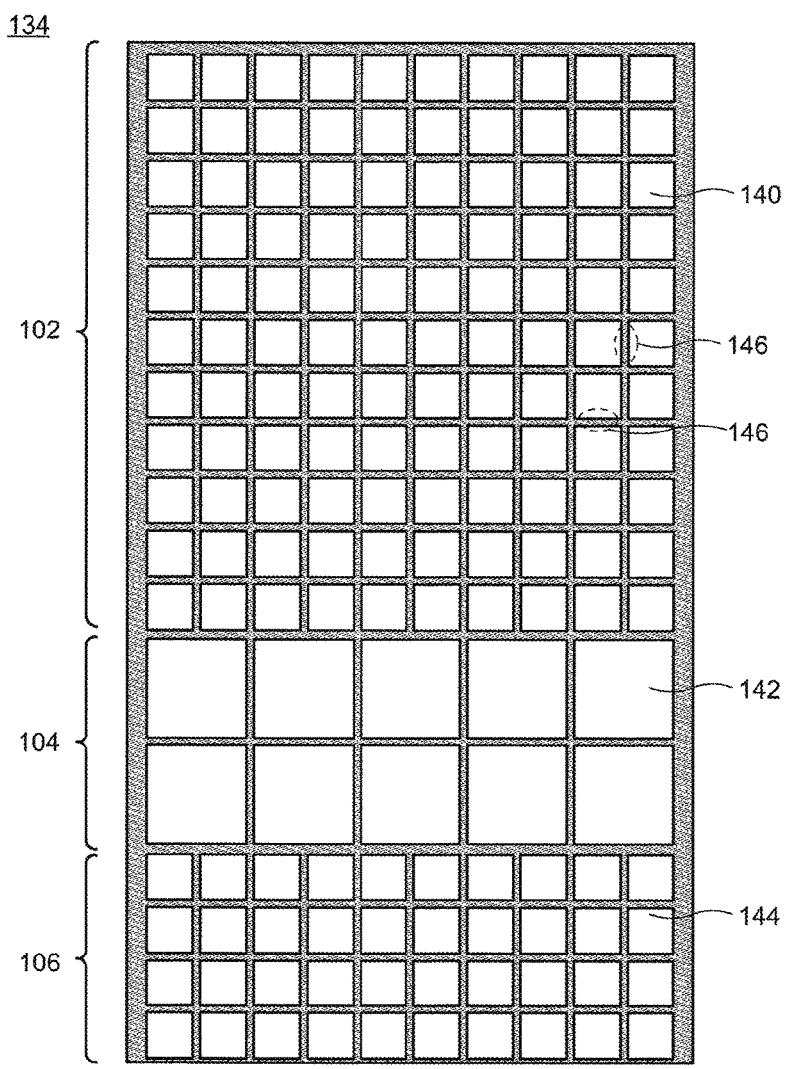
FIG. 5 is a schematic top view of a metal mesh of a display device according to an embodiment.
Figure 6:
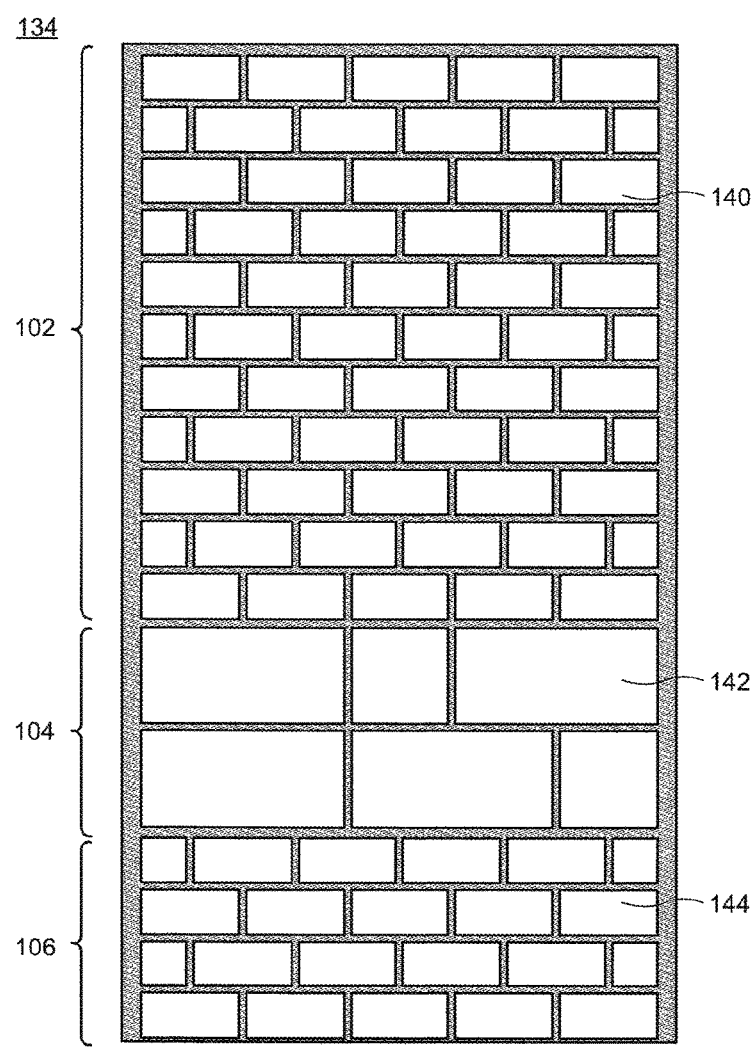
FIG. 6 is a schematic top view of a metal mesh of a display device according to an embodiment.
Figure 7:
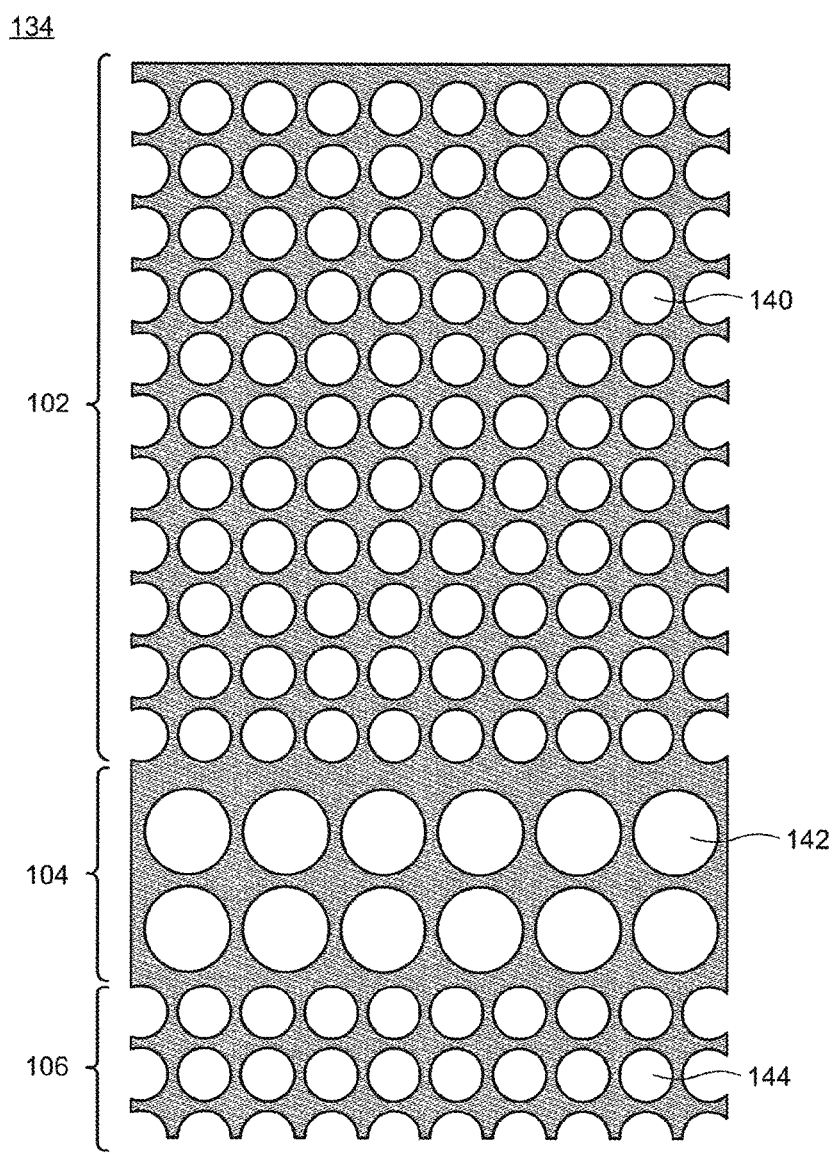
FIG. 7 is a schematic top view of a metal mesh of a display device according to an embodiment.

The structure of the metal mesh 134 is not limited to the structure shown in FIG. 4. In FIG. 4, sides 146 constructing the openings 140, 142, and 144 in each region are inclined from the sides of the display region 112 and the substrate 110. However, the sides 146 may be parallel to the sides of the display region 112 and the substrate 110 as shown in FIG. 5. Alternatively, as shown in FIG. 6, the shapes of the openings 140, 142, and 144 may be rectangular, and rectangles and regular squares may be mixed. Alternatively, as shown in FIG. 7, the openings 140, 142, and 144 may be circular. Although not shown, the openings 140, 142, and 144 may be polygonal, circular, or elliptical, and these shapes may be mixed.

Figure 8:
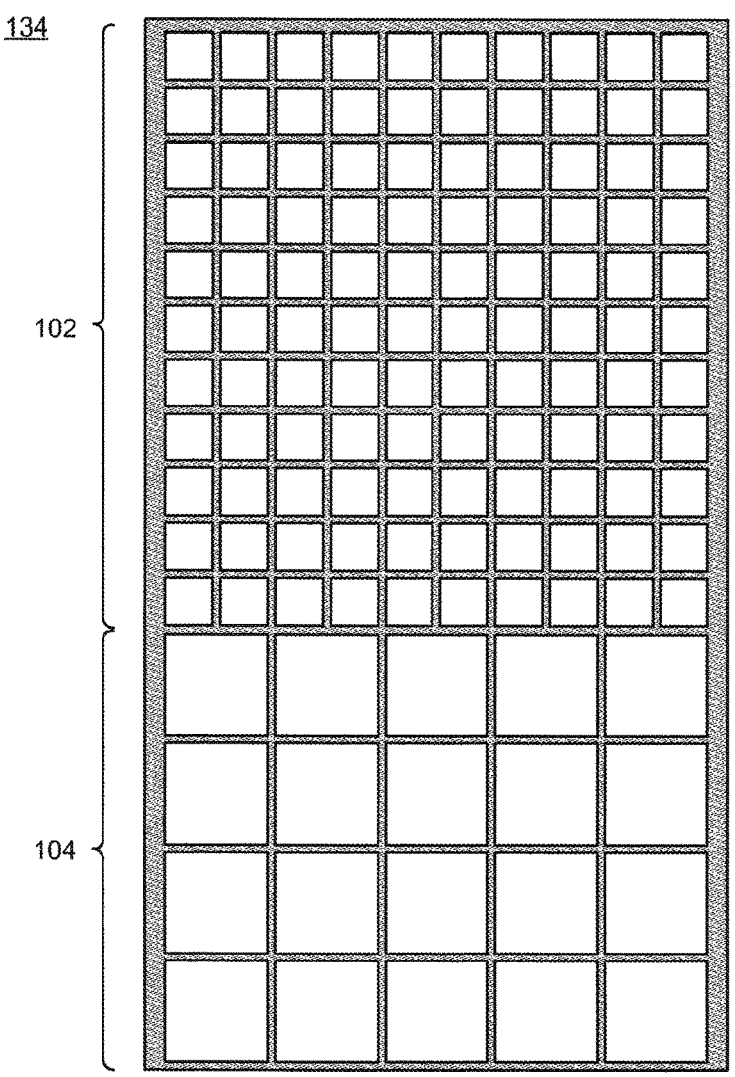
FIG. 8 is a schematic top view of a metal mesh of a display device according to an embodiment.

Alternatively, as shown in FIG. 8, the mesh size 134 may have two regions having different mesh sizes. Here, the first region 102 having a small mesh size and the second region 104 having a large mesh size are formed in the metal mesh 134.

Figure 9A:
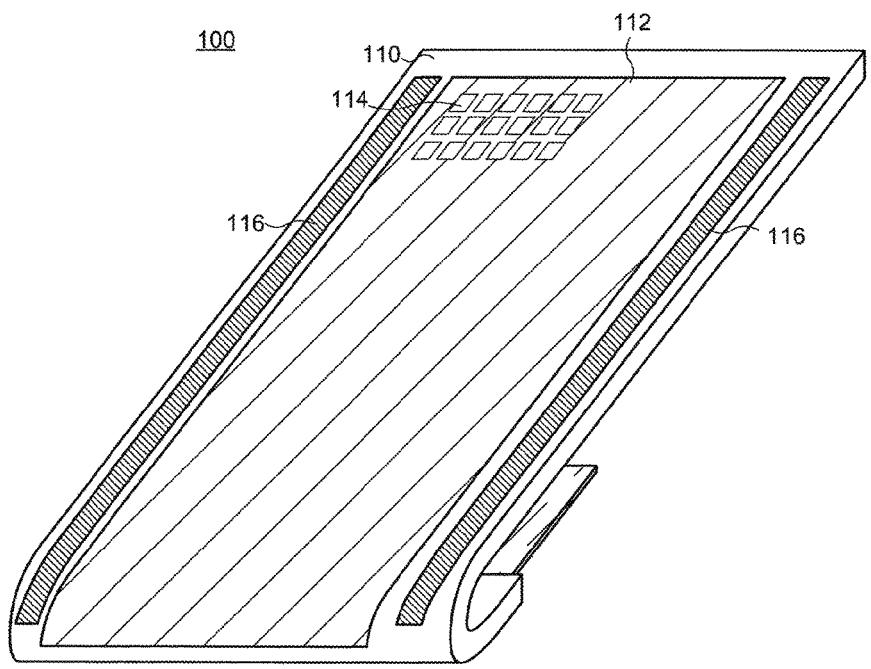
FIG. 9A and FIG. 9B are respectively a schematic perspective view and side view of a display device according to an embodiment.
Figure 9B:
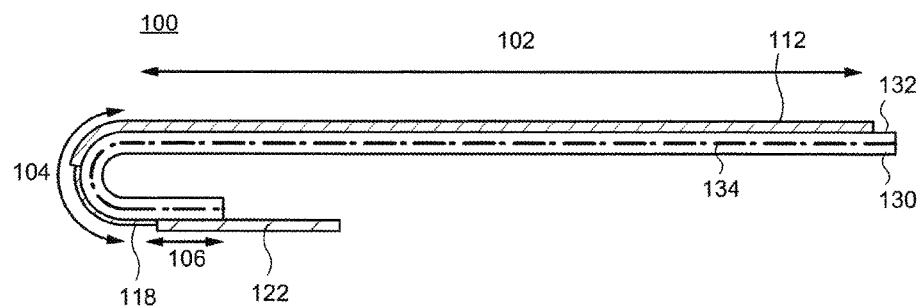

A layout of the regions with different mesh sizes formed in the metal mesh 134 and a layout of the pixels 114, the wirings 118, and the connector 120 which are formed so as to overlap with the metal mesh 134 through the second base film 132 may be arbitrarily designed. Therefore, the display region 112 is not necessarily confined in a region overlapping with the first region 102. For example, as shown in FIG. 9A and FIG. 9B, a part of the display region 112 may overlap with the bent second region 104 through the second base film 132. In this case, most pixels 114 overlap with the first region 102, whereas at least one pixel 114 overlaps with the second region 104.

Figure 10:
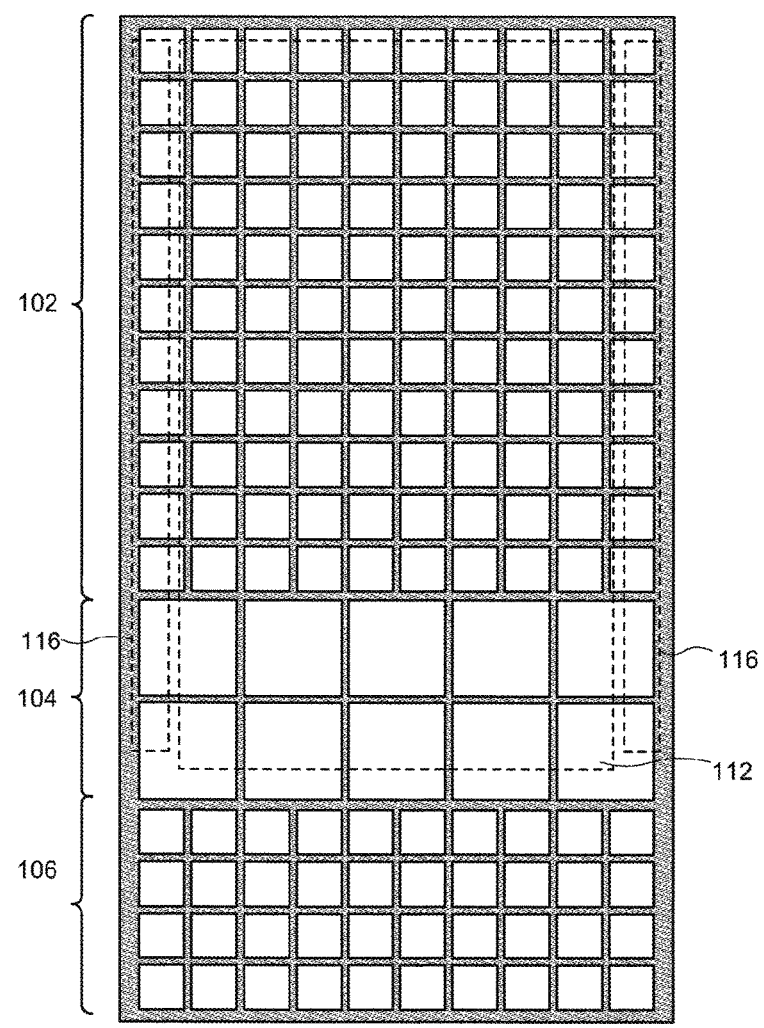
FIG. 10 is a schematic top view of a metal mesh of a display device according to an embodiment.

A layout of the metal mesh 134, the display region 112, and the driver circuits 116 at this time is shown in FIG. 10. As shown in FIG. 10, the second region 104 with a large mesh size may overlap with the display region 112 and the driver circuits 116. In the present embodiment, the layout of each region of the metal mesh 134 may be designed so that a region intended to be bent overlaps with a region with a large mesh size.

The formation of the metal film 134 with a mesh form in such a manner allows a desired region to be bent (bending region) to be readily bent, while other regions can be provided with rigidity larger than that of the bending region. Hence, an intended stereostructure can be readily realized in the display device 100.

Furthermore, employment of this structure improves productivity of a flexible display device. A display device is generally formed by fabricating a plurality of display devices over a large substrate, and then the substrate is divided to provide each display device. In the case where a flexible display device is manufactured, since rigidity of the display device after division tends to be insufficient, it is not always easy to handle the display device. Therefore, lamination processing is conducted on the flexible display device by using a film formed with a polymer material, for example, thereby facilitating handling. However, flexibility is significantly reduced if the lamination processing is carried out, which makes it difficult to bend or fold the display device. Moreover, a material or a manufacturing process of the film may remarkably change the force required to bend the film depending on a bending direction, which makes it difficult to deform the display device into an intended shape.

In contrast, the metal mesh 134 is provided and a thickness thereof is controlled in the present embodiment, by which the flexibility of the entire display device 100 can be readily controlled. Therefore, the display device 100 can be provided with flexibility or rigidity suitable for the manufacturing process, which improves productivity of the display device. Additionally, an increase in mesh size of the metal mesh 134 in a region intended to be bent allows the intended region to be readily bent, thereby providing an intended three-dimensional shape to the display device and maintaining the shape thereof. Moreover, since a metal film is formed in the entire substrate 110, durability to an electrostatic breakdown and heat dissipation are improved, which allows production of a display device with high reliability.

Second Embodiment

In the present embodiment, a manufacturing method of the display device 100 described in the First Embodiment is explained by using FIG. 11 to FIG. 18. An explanation of the content described in the First Embodiment may be omitted.

1. Cross-Sectional Structure

Figure 11:
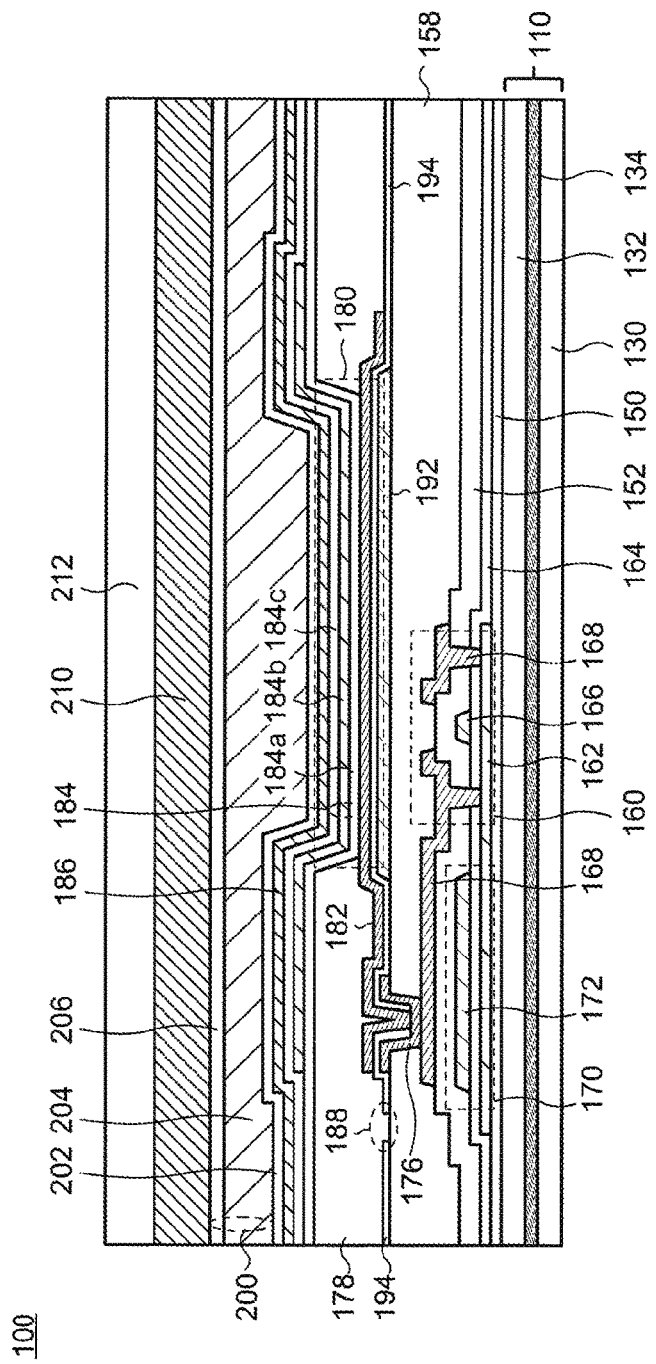
FIG. 11 is a schematic cross-sectional view of a display device according to an embodiment.

A schematic cross-sectional view of the display device 100 is shown in FIG. 11. In this figure, a part of one pixel 114 is illustrated. Here, an example is shown where a transistor 160, a capacitor 170, a light-emitting element 180, and the like are included in one pixel 114. However, a plurality of transistors and a plurality of capacitors may be disposed in the pixel 114.

The display device 100 has the transistor 160 and the capacitor 170 over the substrate 110 described in the First Embodiment through a base film 150 as an optional structure. As shown in FIG. 11, the transistor 160 possesses a semiconductor film 162, a gate insulating film 164, a gate electrode 166, and source/drain electrodes 168, for example. A region of the semiconductor film 162 overlapping with the gate electrode 166 is a channel region, and this channel region is sandwiched by source/drain regions. The source/drain electrodes 168 are electrically connected to the source/drain regions through openings formed in an interlayer film 152 and the gate insulating film 164. The semiconductor film 162 extends to under a capacitor line 172, and the capacitor 170 is formed by the semiconductor film 162, the capacitor line 172, and the gate insulating film 164 sandwiched therebetween.

There is no limitation to the structure of the transistor 160, and not only the so-called top-gate type transistor shown in FIG. 11 but also a bottom-gate type transistor, a multi-gate type transistor having a plurality of gate electrodes 166, or a dual-gate type transistor having the gate electrodes 166 over and under the semiconductor film 162 may be employed. Furthermore, there is no limitation to a vertical relationship between the semiconductor film 162 and the source/drain electrodes 168.

A part of the source/drain electrode 168, a part of the capacitor line 172, and a part of the interlayer film 152 are also a part of the capacitor 170, and the capacitor line 172 is electrically connected to the gate electrode 166 with a wiring not illustrated. The capacitor 170 has a role to maintain a potential provided to the gate electrode 166.

A leveling film 158 which absorbs depressions and projections caused by the transistor 160 and the capacitor 170 and gives a flat surface is formed over the transistor 160 and the capacitor 170. An opening reaching the source/drain electrode 168 is formed in the leveling film 158, and a connection electrode 176 is disposed so as to cover the opening. Note that the connection electrode 176 is also an optional structure.

A supplementary capacitor electrode 192 may be further provided over the leveling film 158. A capacitor insulating film 194 is formed so as to cover the supplementary capacitor electrode 192, a part of the connection electrode 176, and the leveling film 158. The supplementary capacitor electrode 192 forms a supplementary capacitor in association with the capacitor insulating film 194 and a first electrode 182 of the light-emitting element 180 formed thereover, contributing to reduction of emission variation of the light-emitting element 180.

An opening 188 for exposing the leveling film 158 may be formed in a part of the capacitor insulating film 194. This opening 188 functions as an opening to transfer impurities (gas such as water and oxygen) eliminated from the leveling film 158 and the interlayer film 152 to a side of a partition wall 178 formed over the opening 188.

The connection electrode 176 is partly exposed from the capacitor insulating film 184, and the first electrode 182 is formed so as to cover the exposed portion. The partition wall 178 is arranged so as to cover an edge portion of the first electrode 182, by which steps caused by the first electrode 182 are relieved and disconnection of an EL layer 184 and a second electrode 186 formed thereover can be prevented.

The light-emitting element 180 is structured by the first electrode 182, the second electrode 186, and the EL layer 184 arranged therebetween. The EL layer 184 is formed so as to cover the first electrode 182 and the partition wall 178 over which the second electrode 186 is arranged. Carriers (electrons and holes) are injected from the first electrode 182 and the second electrode 186, and recombination takes place in the EL layer 184, which results in formation of an excited state of a molecule included in the EL layer 184. Energy released when the excited state relaxes to a ground state is utilized as light emission. Therefore, a region where the EL layer 184 is in contact with the first electrode 182 is an emission region.

An example is illustrated in FIG. 11 where the EL layer 184 possesses three layers (184a, 184b, and 184c). However, there is no limitation to the layer structure of the EL layer 184, and four or more layers may be stacked. For example, the light-emitting element 180 can be structured by appropriately stacking a variety of functional layers such as a carrier-injection layer, a carrier-transporting layer, an emission layer, a carrier-blocking layer, and an exciton-blocking layer.

In the structure of FIG. 11, the layers 184a and 184c extend to the adjacent pixels 114, while the layer 184b (e.g., emission layer) is selectively provided only in one pixel 114. In this way, the structure of the EL layer 184 may be different between the adjacent pixels 114, thereby giving emission colors different between the adjacent pixels 114. Alternatively, the EL layer 184 having the same structure between the adjacent pixels 114 may be formed. In this case, the light-emitting elements capable of white emission are structured in each pixel 114, and color filters with optical properties different between the adjacent pixels are formed, for example, by which a variety of colors can be extracted from the pixels 114 and a full-color display can be performed.

A passivation film (protection film) 200 for protecting the light-emitting element 180 may be arranged over the light-emitting element 180. A structure of the passivation film 200 may be also arbitrarily selected, and the passivation film 200 may have a three-layer structure as shown in FIG. 11, for example. In this case, the passivation film 200 may have a structure in which an organic layer 204 including an organic compound is sandwiched by two inorganic films (first inorganic film 202 and second inorganic film 204) including an inorganic compound.

A cover film 212 is arranged over the passivation film 200 through a filler 210. The passivation film 200 in addition to the elements formed thereunder is protected by the cover film 212.

2. Manufacturing Method

Hereinafter, a manufacturing method of the display device 100 having flexibility is explained by using FIG. 12A to FIG. 18.

Substrate

First, the substrate 110 is formed over the supporting substrate 156. The supporting substrate 156 has a function to support the substrate 110 and each element formed thereover. Therefore, a material having thermal stability to a process temperature of these elements and chemical stability to chemicals used in the process may be used for the supporting substrate 156. For example, glass, quartz, ceramics, a metal, or the like can be used.

An example of a formation process of the substrate 110 is described below. First, the first base film 130 is formed over the supporting substrate 156 (FIG. 12A). A material with flexibility may be used for the first base film 130, and a polymer material such as a polyimide, a polyamide, a polyester, and a polycarbonate or a precursor thereof can be used. Particles or fibers of glass may be mixed with these materials. The first base film 130 can be formed with a spin-coating method, an ink-jet method, a printing method, a dip-coating method, or the like. Alternatively, the first base film 130 may be formed by attaching a sheet-shaped polymer to the supporting substrate 156 while applying pressure.

Next, the metal mesh 134 is formed over the first base film 130 (FIG. 12B). The metal mesh 134 may be formed directly over the first base film 130 with a chemical vapor deposition (CVD) method (e.g., metal organic CVD (MOCVD) method) or a sputtering method. Alternatively, the metal mesh 134 may be formed by placing the separately prepared metal mesh 134 over the first base film 130 and then applying pressure thereto. In this case, an adhesive may be used. When the metal mesh 134 is separately manufactured, an electroplating method can be used. Alternatively, the metal mesh 134 may be manufactured by mechanically treating a metal thin film to form the plurality of openings (140, 142, and 146).

After that, the second base film 132 is formed over the metal mesh 134 (FIG. 12C). The second base film 132 can be formed by the same method as the first base film 130.

The substrate 110 can be prepared by sequentially stacking the first base film 130, the metal mesh 134, and the second base film 132 over the supporting substrate 156 as described above. However, the substrate 110 may be separately prepared and then placed over the supporting substrate 156.

Transistor and Capacitor

Figure 13A:
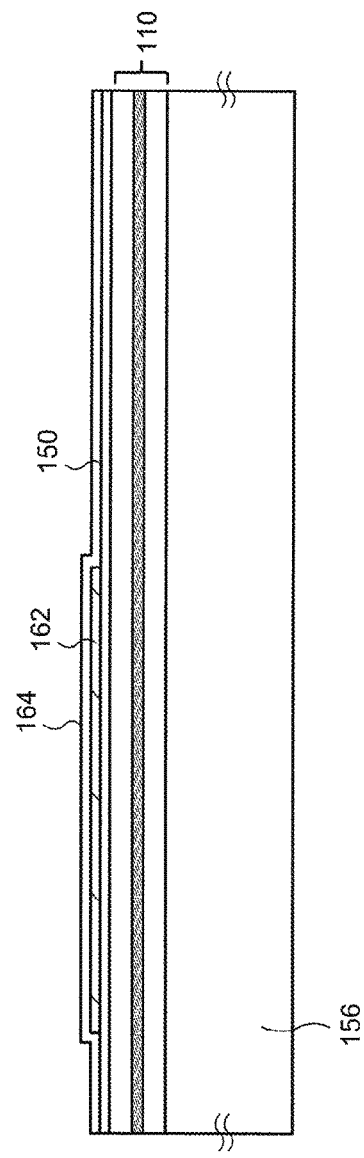
FIG. 13A and FIG. 13B are schematic cross-sectional views for explaining a manufacturing method of a display device according to an embodiment.

Next, the base film 150 is formed over the substrate 110 (FIG. 13A). The base film 150 has a function to prevent impurities from diffusing from the substrate 110 and the supporting substrate 156, may include an inorganic compound such as silicon oxide, silicon oxynitride, silicon nitride oxide, and silicon nitride, and may be prepared with a CVD method or the like. The base film 150 is illustrated so as to have a single-layer structure in FIG. 11. However, the base film 150 may have a structure in which a plurality of layers of an inorganic compound is stacked. For example, a three-layer structure of silicon oxide/silicon nitride/silicon oxide or a two-layer structure of silicon nitride/silicon oxide may be employed.

Next, as shown in FIG. 13A, the semiconductor film 162 is formed over the base film 150. The semiconductor film 162 may contain silicon or an oxide semiconductor and can be formed by a CVD method or a sputtering method. As an oxide semiconductor, a mixed oxide of indium and gallium (IGO), a mixed oxide of indium, gallium, and zinc (IGZO), and the like may be used, for example. Crystallinity of the semiconductor film 162 may be arbitrarily selected and may be amorphous, single crystalline, microcrystalline, or polycrystalline. Moreover, these morphologies may be mixed.

Next, the gate insulating film 164 is prepared over the semiconductor film 162 so as to have a single-layer or stacked layer structure (FIG. 13A). The gate insulating film 164 may be formed by appropriately combining the materials used in the base film 150. The formation method thereof can also be selected from those applicable to the formation of the base film 150.

Next, as shown in FIG. 13A, the gate electrode 166 and the capacitor line 172 are formed over the gate insulating film 164 so as to overlap with the semiconductor film 162. The gate electrode 166 and the capacitor wiring 172 can exist in the same layer because they can be simultaneously formed. The gate electrode 166 and the capacitor wiring 172 may be formed to have a single-layer or stacked-layer structure of a metal such as aluminum, copper, titanium, molybdenum, tantalum, and tungsten or an alloy thereof. For example, they may be formed by stacking a highly conductive metal such as aluminum and copper and a metal with a high blocking property such as titanium and molybdenum. Specifically, a stacked structure of titanium/aluminum/titanium, molybdenum/aluminum/molybdenum, tungsten/aluminum/tungsten, and the like can be employed. As a preparation method of the gate electrode 166 and the capacitor wiring 172, a MOCVD method, a sputtering method, or the like is represented.

A doping treatment may be performed on the semiconductor film 162 if necessary. The doping process allows the formation of the pair of source/drain regions sandwiching the channel region and including impurities in addition to the channel region.

Figure 13B:
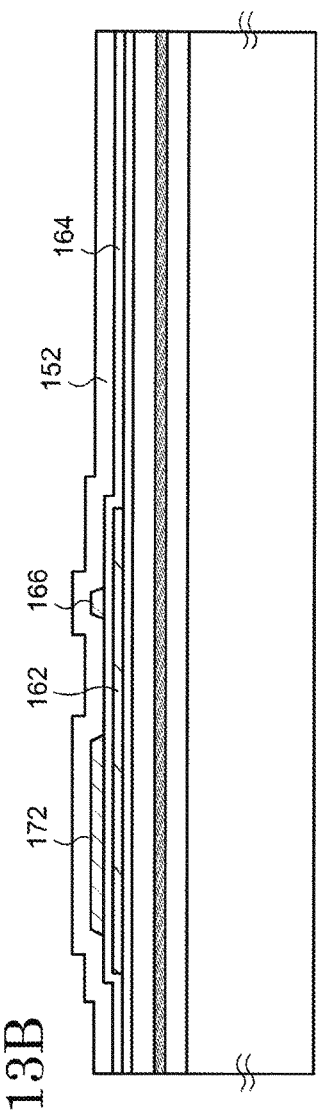

Next, the interlayer film 152 is formed over the gate electrode 166 and the capacitor wiring 172 (FIG. 13B). The interlayer film 152 may by formed by appropriately combining the materials used in the base film 150 and the gate insulating film 164 so as to have a single-layer or stacked-layer structure. For example, a stacked structure of silicon nitride and silicon oxide may be employed.

Figure 14A:
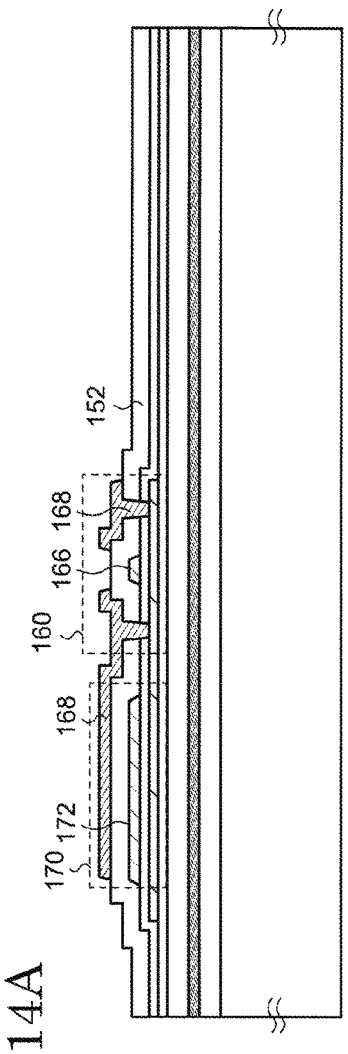
FIG. 14A and FIG. 14B are schematic cross-sectional views for explaining a manufacturing method of a display device according to an embodiment.

After that, etching is performed on the interlayer film 152 and the gate insulating film 164 to form the openings reaching the source/drain regions. The etching can be conducted, for example, by applying dry etching using a fluorine-containing alkane or alkene. Next, a metal film is formed to cover the openings and processed with etching to form the source/drain electrodes 168 (FIG. 14A). The source/drain electrodes 168 can be formed with the same method as that of the gate electrode 166 and may have a stacked structure similar to the gate electrode 166. The source/drain electrodes 168 are formed so as to partly overlap with the capacitor wiring 172. With the above steps, the transistor 160 and the capacitor 170 are formed. Although not shown, the terminals 112 and the wirings 118 are simultaneously formed through the formation and etching of the metal film.

Figure 14B:
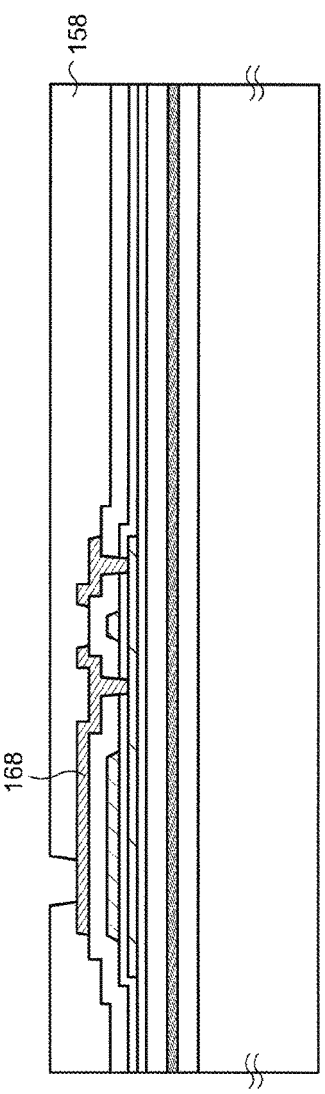

Through these steps, depressions and projections due to the transistor 160 and the capacitor 170 are generated over the substrate 110. However, these depressions and the projections can be absorbed and a flat surface can be provided by forming the leveling film 158 (FIG. 14B). The leveling film 158 can be prepared by using a polymer material such as an acrylic resin, an epoxy resin, a polyimide, and a polysiloxane with a spin-coating method, a dip-coating method, a printing method, or the like. Although not shown, a protection film (e.g., a protection film formed with an inorganic insulating film) may by further formed over the leveling film 158.

Light-Emitting Element and Supplementary Capacitor

Figure 15A:
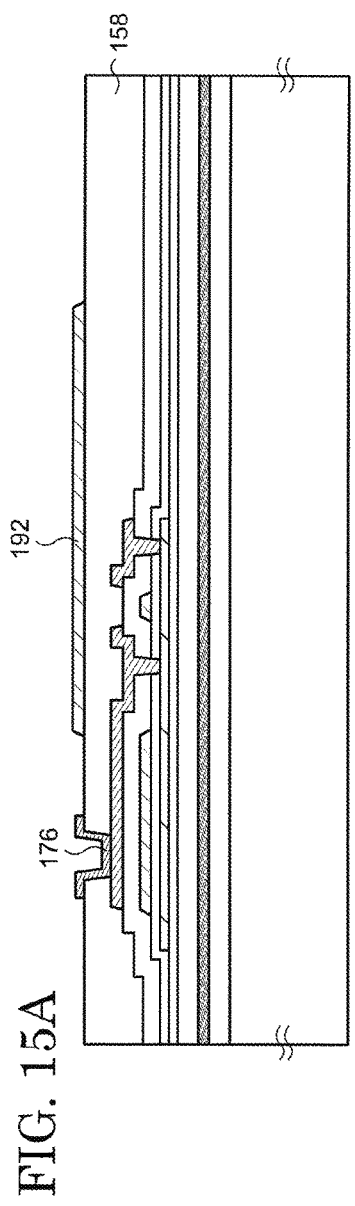
FIG. 15A and FIG. 15B are schematic cross-sectional views for explaining a manufacturing method of a display device according to an embodiment.

Next, etching is performed on the leveling film 158 to expose a part of the source/drain electrode 168 (FIG. 14B). After that, the connection electrode 176 is prepared so as to cover this opening (FIG. 15A). The connection electrode 176 may contain a conductive oxide having a light-transmitting property, such as indium-tin oxide (ITO) and indium-zinc oxide (IZO), and may be formed by applying a sputtering method, a sol-gel method, or the like. Note that formation of the connection electrode 176 is optional. However, the formation of the connection electrode 176 prevents or reduces damage to the source/drain electrode 168 in the following processes, by which generation of contact resistance in the electrical contact can be effectively inhibited between the source/drain electrode 168 and the light-emitting element 180.

Figure 15B:
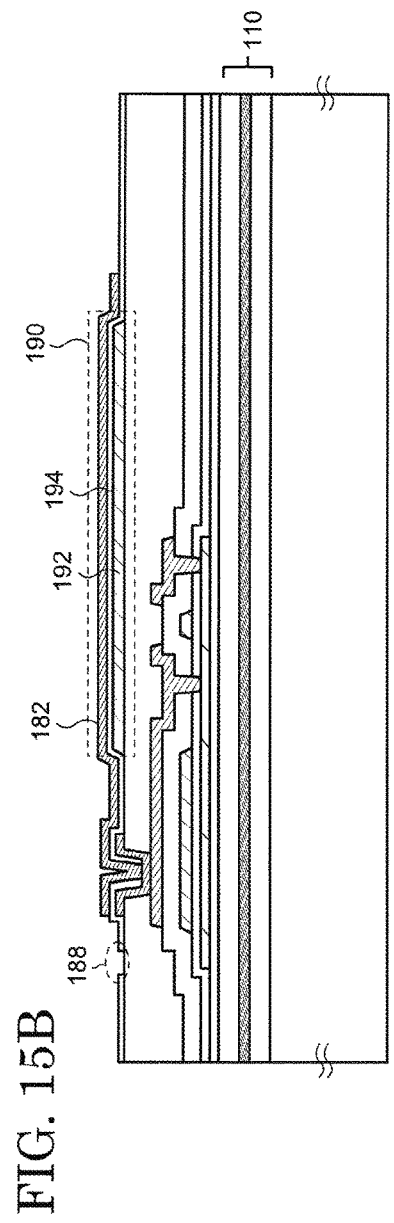

Next, the supplementary capacitor electrode 192 is formed over the leveling film 158 (FIG. 15A). The supplementary capacitor electrode 192 can also have the same structure as the gate electrode 166 and the source/drain electrodes 168. After that, the capacitor insulating film 194 is formed (FIG. 15B). The capacitor insulating film 194 protects the leveling film 158 and further functions as a dielectric film of the supplementary capacitor 190. An opening for exposing a part (bottom surface) of the connection electrode 176 is formed in the capacitor insulating film 194. At this time, the opening 188 exposing the leveling film 158 may be formed.

Next, the first electrode 182 of the light-emitting element 180 is formed over the capacitor insulating film 194 so as to cover the connection electrode 176 and overlap with the supplementary capacitor electrode 192 (FIG. 15B). A metal reflecting visible light or a conductive oxide transmitting visible light can be used for the first electrode 182. When light emission from the light-emitting element 180 is extracted from a side of the substrate 110, the first electrode 182 may be formed by using a conductive oxide having a light-transmitting property, such as ITO and IZO, and applying a sputtering method, a sol-gel method, or the like. On the other hand, when the light-emission from the light-emitting element 180 is extracted from an opposite side to the substrate 110, a metal with high reflectance, such as aluminum and silver may be used for the first electrode 182. In this case, a conductive oxide may be stacked over and/or under the metal. For example, a stacked structure of ITO/silver/ITO, IZO/aluminum/IZO, or the like can be employed. Through the processes up to this process, the supplementary capacitor 190 structured by the supplementary capacitor electrode 192, capacitor insulating film 194, and the first electrode 182 is fabricated.

Next, an insulating film is formed to cover the edge portion of the first electrode 182 to form the partition wall 178 (FIG. 16A). The partition wall 178 not only covers the edge portion of the first electrode 182 to prevent a short circuit between the first electrode 182 and the second electrode 186, but also has a function to electrically insulate adjacent pixels 114 from each other. A polymer material such as an acrylic resin, an epoxy resin, a polyimide, a polyamide, and a polysiloxane can be used for the partition wall 178.

After the formation of the partition wall 178, the EL layer 184 and the second electrode 186 are formed (FIG. 16B). As described above, the EL layer 184 is a layer in which the recombination of the carriers injected from the first electrode 182 and the second electrode 186 takes place and is formed by combining a variety of functional layers. The EL layer 184 can be formed by utilizing an evaporation method, an ink-jet method, a spin-coating method, or the like.

The material the same as that of the first electrode 182 may be used for the second electrode 186. When the light-emission from the EL layer 184 is extracted from a side of the first electrode 182, a material having high reflectance to visible light is preferred for the second electrode 186, and silver, aluminum, and the like can be used, for example. The second electrode 186 can be formed by applying an evaporation method, a sputtering method, or the like to these materials. In contrast, when the light is extracted from a side of the second electrode 186, a conductive oxide such as ITO and IZO can be used. Alternatively, the second electrode 186 can be formed by using magnesium, silver, or an alloy thereof at a thickness (several to several tens of nanometers) which permits visible light to pass therethrough. The second electrode 186 may be formed by stacking a conductive oxide over the metal or alloy. With the above processes, the light-emitting element 180 and the supplementary capacitor 190 are fabricated.

Passivation Film and Cover Film

Next, the passivation film 200 is formed over the second electrode 186 (FIG. 17). This passivation film 200 has a function to prevent entrance of impurities such as water and oxygen to the light-emitting element 180 from outside. As an example of the passivation film 200, a three-layer structure shown in FIG. 17 is represented. In this case, the passivation film 200 can have a structure where an organic film 204 including an organic compound is sandwiched by two inorganic films including an inorganic compound (first inorganic film 202 and second inorganic film 206).

The first inorganic film 202 is formed over the second electrode 186. The first inorganic film 202 may include an inorganic material such as silicon nitride, silicon oxide, silicon nitride oxide, and silicon oxynitride and may be formed with the same method as the base film 150.

Next, the organic film 204 is formed. The organic film 204 may include an organic resin including an acrylic resin, an epoxy resin, a polysiloxane, a polyimide, and a polyester. Moreover, as shown in FIG. 17, the organic film 204 may be formed at a thickness which allows depressions and projections caused by the partition wall 178 to be absorbed and a flat surface to be provided. The organic film 204 can be formed with a wet-type film-formation method such as an ink-jet method and a printing method. Alternatively, the organic film 204 may be prepared by atomizing or gasifying oligomers serving as a raw material of the aforementioned organic resin under a reduced pressure, spraying the first inorganic film 202 with the oligomers, and then polymerizing the oligomers.

After that, the second inorganic film 206 is prepared (FIG. 17). The second inorganic film 206 may have the same structure and may be formed with the same method as those of the first inorganic film 202. Through the above processes, the passivation film 200 is fabricated. The formation of the passivation film 200 prevents entrance of impurities into the display device 100, improving reliability of the display device 100.

Next, the cover film 212 is disposed over the passivation film 200 through the filler 210. The filler 210 has a function to adhere the passivation film 200 and the cover film 212, and an epoxy resin, an acrylic resin, and the like can be used. A desiccant may be mixed with the filler 210. The cover film 212 has a function to protect the surface of the display device 100 from physical impact and may include a polymer material such as a polycarbonate, a polyolefin, a polyester, a polyimide, a polyamide, and a polysiloxane. When the display device is not provided with flexibility, a substrate the same as the supporting substrate 156 may be used. In this case, the cover film 212 may be called an opposing substrate. Although not shown, a touch sensor may be arranged between the passivation film 200 and the filler 210 or over the cover film 212 as an optional structure. As a typical example of a touch sensor, a projection-capacitive touch panel is represented. A color filter, a light-shielding film, and a polarizing plate may be formed between the passivation film 200 and the filler 210.

Separating Process

Figure 18:
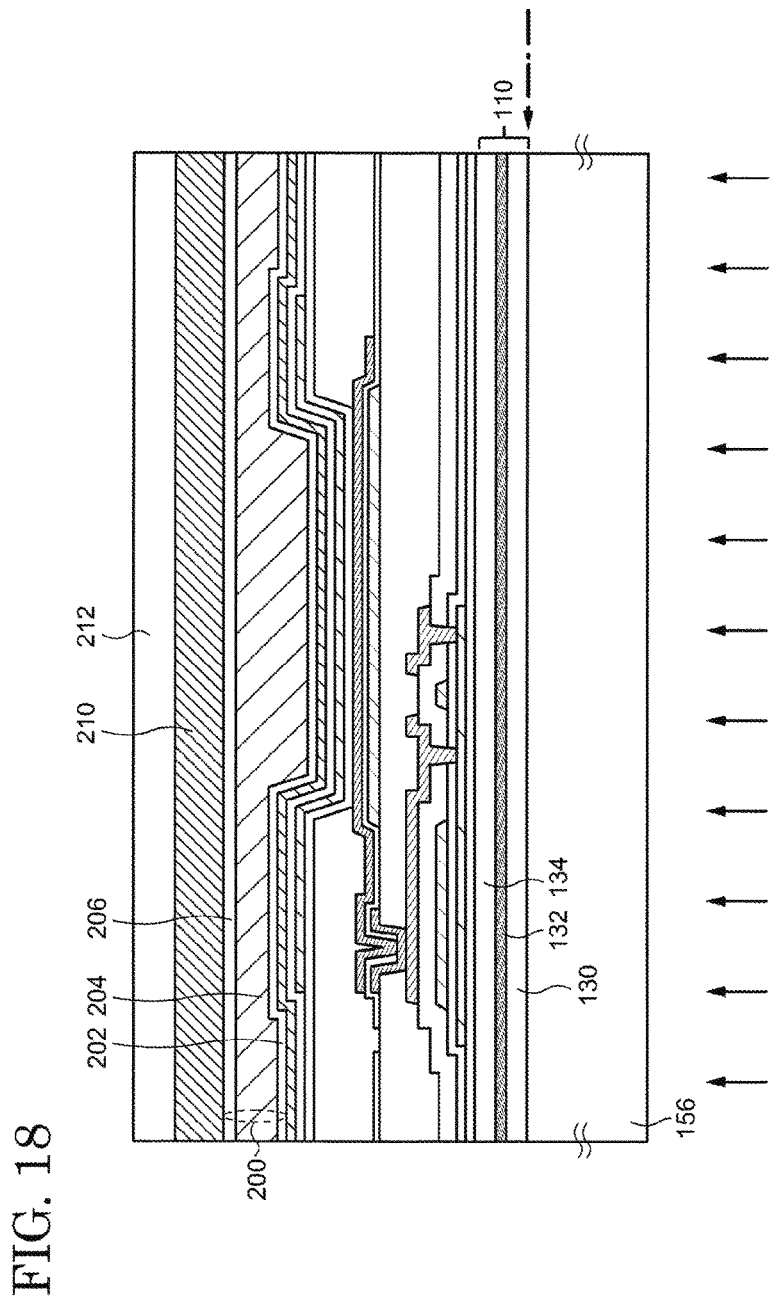
FIG. 18 is a schematic cross-sectional view for explaining a manufacturing method of a display device according to an embodiment.

Next a separation process is carried out to peel the supporting substrate 156 from the substrate 110, giving flexibility to the display device 100. Specifically, as shown in FIG. 18, light-irradiation is conducted by using a light source such as a laser or a flash lamp to decrease the adhesion between the supporting substrate 156 and the substrate 110. After that, the supporting substrate 156 is physically peeled from the substrate 110 along an interface indicated by a chain arrow. With this step, the display device 100 shown in FIG. 11 is manufactured. The light-irradiation may be carried out through the supporting substrate 156. Although not shown, a flexible film may be arranged, as an optional structure, under the substrate 110 after peeling. As a flexible film, a film the same as the cover film 212 may be used. Through these steps, the display device 100 can be manufactured.

After that, the display device 100 may be deformed into an arbitral shape. As described in the First Embodiment, the metal mesh 134 has the second region 106 having higher flexibility than those of the first region 102 and the third region 106. Therefore, the display device 100 can be readily deformed by utilizing the flexibility of the second region 106 because the second region 106 is readily bent. Simultaneously, the first region 102 which overlaps most of the display region 112 is able to maintain a flat shape, by which excellent image visibility can be secured.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by the persons ordinarily skilled in the art.

What is claimed is:

1. A display device comprising:
    a substrate including:
    a first base film;
    a second base film;
    a metal mesh located between the first base film and the second base film and having a first region and a second region; and
    a plurality of pixels overlapping with the first region over the second base film,
    wherein the second region is bent, and
    a mesh size of the second region is larger than a mesh size of the first region.

2. The display device according to claim 1, further comprising:
    terminals overlapping with the second region through the second base film; and
    wirings electrically connecting the plurality of pixels to the terminals.

3. The display device according to claim 2, wherein the wirings overlap with the second region through the second base film.

4. The display device according to claim 1, wherein at least a second pixel overlaps with the second region.

5. The display device according to claim 1, wherein the substrate exists in a bent state so that the second region is bent.

6. The display device according to claim 1, wherein the metal mesh includes a 0-valent metal.

7. The display device according to claim 1, wherein the second region is more flexible than the first region.

8. The display device according to claim 1, wherein the first region and the second region each have an opening, and
    the opening of the second region is larger than the opening of the first region.

* * * * *